United States Patent [19]

Finger

[11] Patent Number: 4,514,694
[45] Date of Patent: Apr. 30, 1985

[54] QUIESCENT BATTERY TESTING METHOD AND APPARATUS

[75] Inventor: Eugene P. Finger, Brewster, N.Y.

[73] Assignee: Curtis Instruments, Mt. Kisco, N.Y.

[21] Appl. No.: 401,383

[22] Filed: Jul. 23, 1982

Related U.S. Application Data

[63] Continuation-in-part of Ser. No. 286,271, Jul. 23, 1981, Pat. No. 4,460,870.

[51] Int. Cl.³ ............................................. G01N 27/46
[52] U.S. Cl. ..................................... 324/429; 324/433
[58] Field of Search ............... 324/426, 428, 429, 430, 324/427, 433; 340/636; 320/39, 48

[56] References Cited

U.S. PATENT DOCUMENTS

| | | | |
|---|---|---|---|
| 3,890,556 | 6/1975 | Melling et al. | 320/39 |
| 3,971,980 | 7/1976 | Jungfer et al. | 324/427 |
| 4,028,616 | 6/1977 | Stevens | 324/433 |
| 4,080,560 | 3/1978 | Abert | 320/48 |
| 4,193,025 | 3/1980 | Frailing et al. | 324/427 |
| 4,322,685 | 3/1982 | Frailing et al. | 324/429 |
| 4,342,963 | 8/1982 | Karnowski et al. | 324/427 |

FOREIGN PATENT DOCUMENTS 2000596  2/1982  United Kingdom .

OTHER PUBLICATIONS

Popular Mechanics, "Guard Your Battery with PM's Charge Checker", vol. 151, No. 5, May 1979, pp. 84, 86, 264.

Primary Examiner—Michael J. Tokar
Assistant Examiner—Kevin D. O'Shea
Attorney, Agent, or Firm—Curtis Ailes

[57] ABSTRACT

The invention relates to apparatus for determining the state of charge of electric storage batteries.

The apparatus makes use of known quiescent battery (16) terminal voltage recovery characteristics after a prior energy transfer to predict the ultimate steady state terminal voltage as a measure of state of charge. In one embodiment, this is accomplished by using a voltage-controlled oscillator (18) and a reversible counter (20) to measure a first battery (16) terminal voltage over a fixed time interval, storing that measurement in a register (24), measuring a second terminal voltage by reversing the counter (24) and counting the counter down for an identical fixed interval of time, and then determining the slope of the voltage recovery (at) (26) (30) based upon the difference between the two voltage measurements as evidenced by the count remaining in the counter (20) and adding a factor (at) (74) to the first voltage measurement based upon the voltage difference measurement to determine a predicted steady state voltage as an indication (28) of the charge on the battery.

32 Claims, 4 Drawing Figures

QUIESCENT BATTERY TESTING METHOD AND APPARATUS

CROSS REFERENCE TO RELATED APPLICATION

This application is a continuation-in-part of prior application Ser. No. 286,271, U.S. Pat. No. 4,460,870 filed in the United States July 23, 1981.

The present invention relates to methods and apparatus for determining the condition of charge of an electric storage battery such as a lead acid battery under quiescent conditions when there is no current flow through the battery terminals.

BACKGROUND OF THE INVENTION

Many different approaches have been made to the problem of monitoring and indicating the discharge condition of electric storage batteries, especially in applications where the battery is first charged and then is used in the discharge mode for a considerable period of time, such as in a mobile vehicle, before it is again returned to the charger to be re-charged.

Various battery terminal voltage measurement systems have been employed for the purpose of monitoring battery discharge, with varying degrees of success. The present invention is essentially in this category.

One approach is simply to measure and read the instantaneous battery terminal voltage on a continuing basis. However, this requires interpretation, since the terminal voltage varies during operation of the apparatus powered by the battery, having a depressed value during loading, dependent upon the magnitude of the load.

Various unidirectional systems have been devised for detecting and registering downward excursions in battery voltage under load, as an indication of the discharge condition of the battery. Some of these have operated on the basis of recognition of a sustained undervoltage condition before any registration is made, and others are really undervoltage analyzers which recognize and register undervoltage conditions in a setting recognizing previously registered undervoltage conditions. Very accurate results have been obtained with such systems especially when applied to apparatus having known patterns of loading, even where the loading is quite discontinuous, such as in the operation of industrial fork lift trucks. Examples of successful systems of this sort are disclosed in a prior U.S. Pat. No. 4,193,026 issued to Eugene P. Finger and Eugene A. Sands on Mar. 11, 1980 and assigned to the same assignee as the present application.

The above mentioned devices are sometimes referred to as "fuel gauges" since they are intended to indicate how much operating capacity remains in the battery of the vehicle. These devices are intended to be continuously connected to the vehicle or apparatus whose batteries are being monitored so as to analyze the operating history of the battery as a basis for a continuing calculation and indication of the remaining charge on the battery.

There is an important need for a battery tester which is capable of easily and conveniently providing an indication of the charge state of a battery without the necessity for having the device constantly connected to, or associated with, the battery. Such a tester would be especially valuable in a battery charging facility where it may be desired to determine the charge state of batteries which are held in temporary storage to make certain which batteries have been charged, and whether they have been fully charged or not, or to determine how much charge they need if they are not charged. Such a tester or testing method would also be useful for the purpose of determining the charge state of batteries in an electric vehicle or other apparatus which is not equipped with a "fuel gauge" of sufficient accuracy, or which has no "fuel gauge".

One of the most common present methods for determining the state of charge of batteries in a test procedure is by checking the specific gravity of the fluid electrolyte. This means removing the cap from each battery cell, inserting the electrolyte tester tube into that cell, drawing electrolyte liquid into the tester, waiting until the fluid level is steady, and then attempting to read the position of the meniscus of the fluid in the tester in relation to a float scale to provide a specific gravity reading. The fluid must then be returned to the cell and the cell cover again closed. This procedure must be repeated eighteen times for a thirty-six volt battery to have a complete reading.

Even if a sampling procedure is used, in which three or four cells are tested, and the others are assumed to be the same, the procedure is still very time consuming and the accuracy of the reading is seriously limited. Another very serious problem with the accuracy of the reading arises from the fact that it is only the stabilized steady state specific gravity of the electrolyte which is an accurate indication of the state of charge of the battery. Thus, if the battery has been in a non-quiescent condition (connected for either charge or discharge) for less than a number of hours before the specific gravity is taken, the specific gravity reading is not an accurate indication of the remaining state of charge. Many hours are required for the specific gravity to stabilize sufficiently to provide a reasonably accurate reading. Furthermore, there is always a risk of spilling the battery acid electrolyte. Accordingly, the conventional specific gravity measurement has a number of serious disadvantages.

There is also an important need for a battery tester which is simply capable of quickly providing an indication as to whether a battery was last subjected to a charge or discharge operation. In a battery charging facility, this will provide a quick confirmation as to which batteries have already been charged, and which batteries still need to be charged.

SUMMARY OF THE INVENTION

It has been recognized that one of the most accurate voltage measurements for indicating the battery state of charge for many battery systems, including lead-acid, is the stabilized open circuit battery terminal voltage. That voltage is very closely related to the stabilized specific gravity of the electrolyte. However, it typically takes a number of hours or even days for the open circuit battery voltage to stabilize after each charge or discharge interval, so that the stabilized reading is simply not available without an impractical wait for the stabilized condition. Usually, the battery state of charge information is needed most while the battery is being discharged or charged, or soon after a discharge or charge interval.

It is an object of the present invention to provide a new method and apparatus utilizing battery terminal voltage measurements for determining the state of charge of the battery.

It is another object of the invention to provide a new battery state of charge indicating method and apparatus which may be based solely upon measurements of battery terminal voltage under quiescent conditions.

It is another object of the present invention to provide a novel method and apparatus for measuring battery terminal voltages under quiescent battery conditions in such a way as to provide an accurate prediction of the ultimate stabilized open circuit battery terminal voltage as a basis for indicating the state of charge of the battery.

It is still another object of the invention to provide a method and apparatus for quickly indicating whether the battery was last charged or discharged.

The present inventor has discovered that after an interval of current flow through a battery, (a current exchange operation) either because of charging or discharging, the battery terminal voltage tends to adjust rapidly, during an initial brief interval after discontinuance of the current, to a voltage value which is substantially independent of the magnitude of the prior current flow through the battery, and which is substantially completely dependent upon the state of charge of the battery. However, from that point on, the terminal voltage value continues to change as a very predictable function of the elapsed time after current interruption, adjusting towards the ultimate stabilized open circuit voltage. The present invention takes advantage of this principle by taking at least two time separated battery terminal voltage samples when the battery is quiescent, and relating those samples to the known voltage recovery characteristics of the battery.

In carrying out the invention, there may be provided a quiescent battery testing method for testing a battery which is not connected to a load or to a charging source comprising the steps of taking a first battery terminal voltage measurement, noting said first measurement, taking a second terminal voltage measurement at a subsequent time, and comparing said second measurement with said first measurement to determine the direction of voltage change from said first measurement to said second measurement as a basis for determining whether the battery was last subjected to charge or discharge.

DESCRIPTION OF PREFERRED EMBODIMENTS

Figure 1:
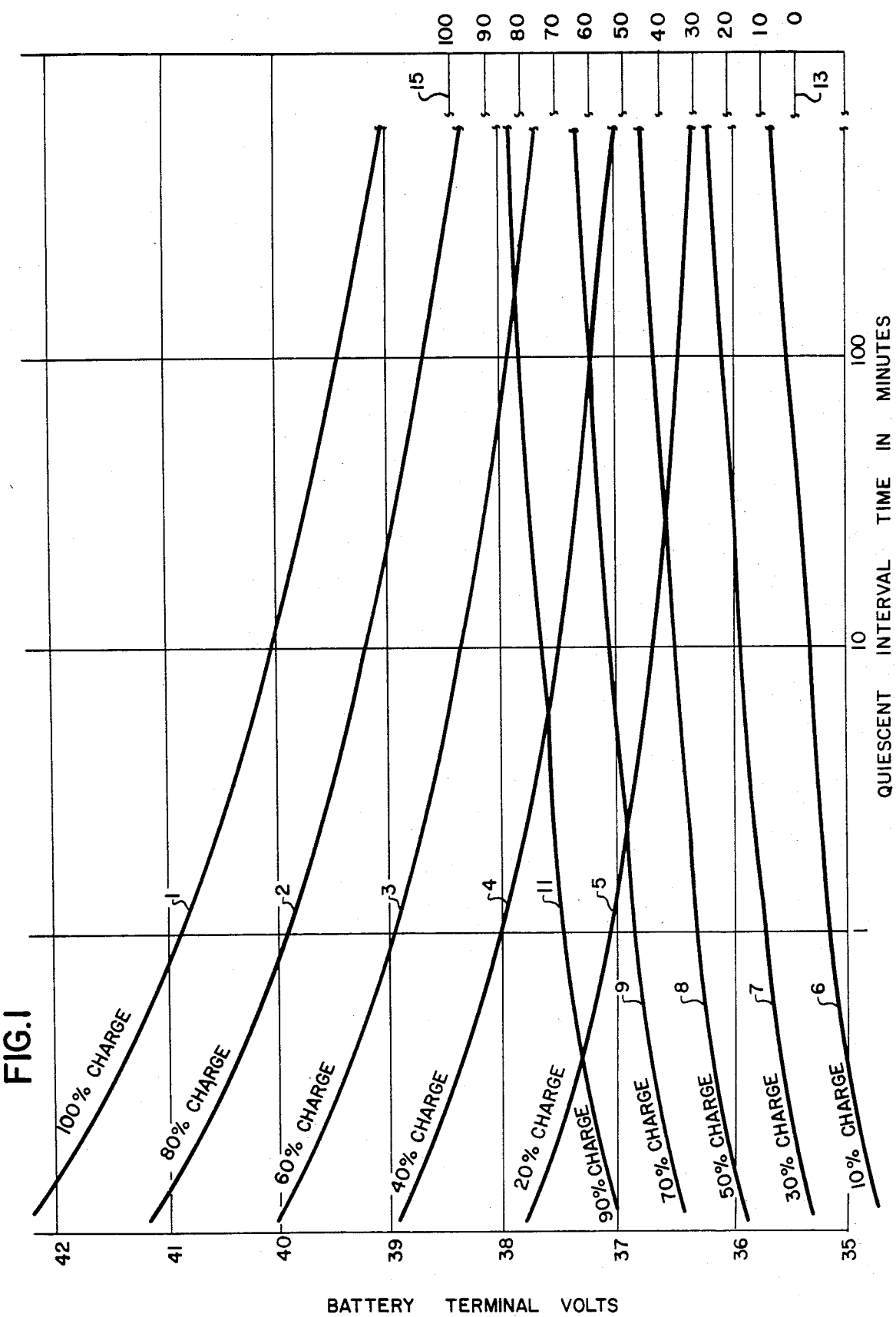
FIG. 1 shows typical plots of battery terminal voltage recovery curves versus time after termination of battery current at various states of charge, with an expanded voltage scale and a logarithmic time scale.

Referring more particularly to FIG. 1, there is shown two series of voltage curves plotted on an expanded vertical scale for nominal 36 volt battery systems. These curves are plotted on a logarithmic horizontal scale representing the time duration of the quiescent interval after termination of battery current. The upper set of curves, designated 1 through 5, which incline downwardly, represent battery open circuit voltage respectively at different states of charge versus time after termination of a charge operation. The lower set of curves designated 6 through 9 and 11, which incline upwardly, represent battery open circuit voltage respectively at different states of charge versus time after termination of a discharge operation.

Curve 1 represents the condition of 100% charge, and it is so marked. Curves 2, 3, 4, and 5 respectively represent 80% charge, 60% charge, 40% charge, and 20% charge states. Similarly, curves 6 through 9 and 11 respectively represent 10%, 30%, 50%, 70%, and 90% charge states, and are respectively so marked.

The curves represent voltage stabilization characteristics to be expected from a particular 800 ampere hour lead acid traction battery having 18 cells at a temperature of 25° C. The curves are typical of those to be expected from this battery type. For this battery, the ultimate stabilized open circuit voltage may be expressed as a function of battery charge to a very close approximation by the following expression:

Open circuit voltage $= 35.46 + 0.0288$ P.

(Where P = the percent of full charge on the battery.)

This expression calls for a fully discharged stabilized open circuit voltage of 35.46, and a fully charged stabilized open circuit voltage of 38.34 volts. These values are respectively shown, for reference purposes, in FIG. 1 at the right margin of the drawing at 13 and 15. Stabilized open circuit voltages for intermediate charge states are indicated at 10% intervals between the extreme values at 13 and 15. These stabilized open circuit voltage values are not related to the horizontal time scale since the stabilized voltage values are not actually achieved until a time substantially beyond the time scale shown, even though the time scale is a logarithmic scale.

The curves of FIG. 1 are idealized to some extent, but they generally represent the character of actual data on actual batteries. In the earliest portions of the quiescent intervals, up to about one tenth of a second, the recovery voltage characteristic has been found to be very much dependent upon the magnitude of the prior battery current. However, it has been discovered that after about one tenth of a minute, and especially after about one minute, all of the curves become quite mathematically predictable and regular, and appear to be substantially independent of the magnitude of the current prior to commencement of the quiescent interval, as long as there is a substantial energy transfer in a nominal period of time. Thus, the curves are almost straight lines, as plotted on the horizontal logarithmic scale, and thus represent essentially logarithmic functions, or at least predictable exponential functions. Because of this, the curves represent a basis for accurate prediction of the ultimate steady state open circuit terminal voltage, and that prediction provides a basis for accurately indicating the state of charge of the battery.

Figure 2:
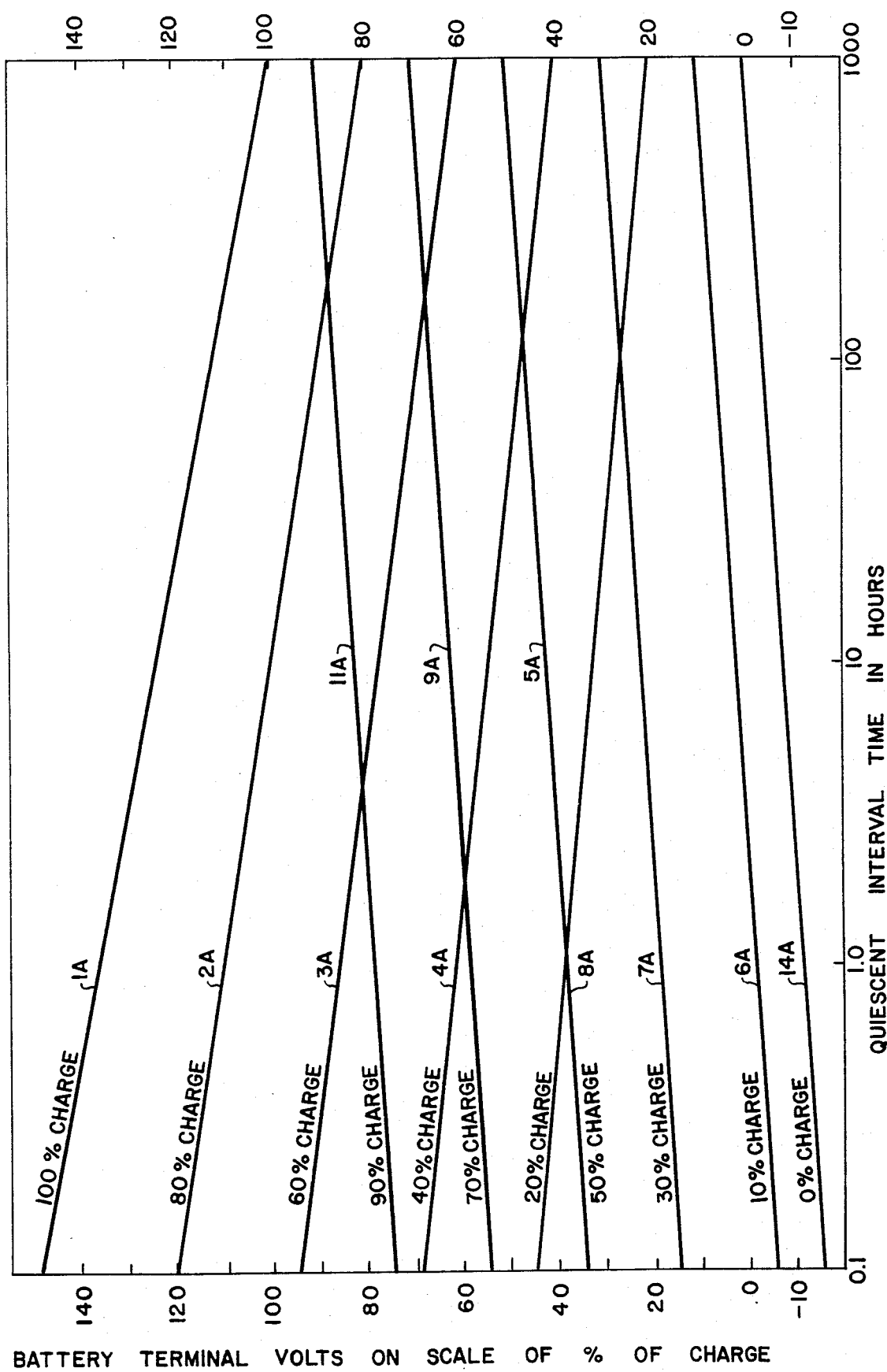
FIG. 2 is a modified version of FIG. 1, in which time is plotted in hours, rather than minutes, and in which the voltage curves are shown as idealized logarithmic functions of time.

FIG. 2 is an idealized redrawing of FIG. 1 in which the quiescent interval time is plotted in hours, rather than in minutes, beginning with 1/10 of an hour (6 minutes) and continuing to 1000 hours, which is a very substantial extension of the time scale over FIG. 1. Additionally, in FIG. 2, the vertical scale is shown entirely in terms of the percent of stabilized battery capacity (as indicated by the stabilized terminal voltage) rather than by use of a battery terminal voltage scale.

One thousand hours corresponds to almost 42 days, which is much more than enough time to achieve stabilization for most batteries, and it may actually be so far into the quiescent state that "self-discharge" effects will have set in.

The curves of FIG. 1 are all again shown in FIG. 2, and are designated with the same numbers, but with a suffix letter A. Thus, curve 1 of FIG. 1 is again shown in FIG. 2 as curve 1A. The curves of FIG. 2 are idealized as straight lines on a semi-logarithmic plot. It has been found that such lines provide a rather accurate representation of the voltage recovery characteristics of the terminal voltage of the battery, particularly for the time intervals shown from about 6 minutes after the beginning of quiescence to 1000 hours. It has been found that the recovery curves from a last previously charged state, curves 1A, 2A, 3A, 4A, and 5A, do not have a common slope. Thus, the 100% charge curve 1A has a slope of about minus 12% per decade, the 80% charge curve 2A has a slope of minus 10% per decade, the 60% charge curve 3A has a slope of minus 8% per decade, the 40% charge curve 4A has a slope of about minus 7% per decade and the 20% charge curve 5A has a slope of about 6% per decade. In this context, a "decade" refers to the interval on the horizontal scale from one point to a subsequent point which represents 10 times the elapsed time. Thus, from 1 to 10 on the horizontal scale is one "decade".

By contrast, the curves 6A through 11A, and 14A, which represent voltage recovery from a discharge state have an almost uniform slope of about 4% per decade. In addition to all of the curves discussed above, which are illustrated in FIG. 1 and repeated in FIG. 2, FIG. 2 includes an additional curve 14A at the bottom of the figure which relates to a 0% charge condition.

Figure 3:
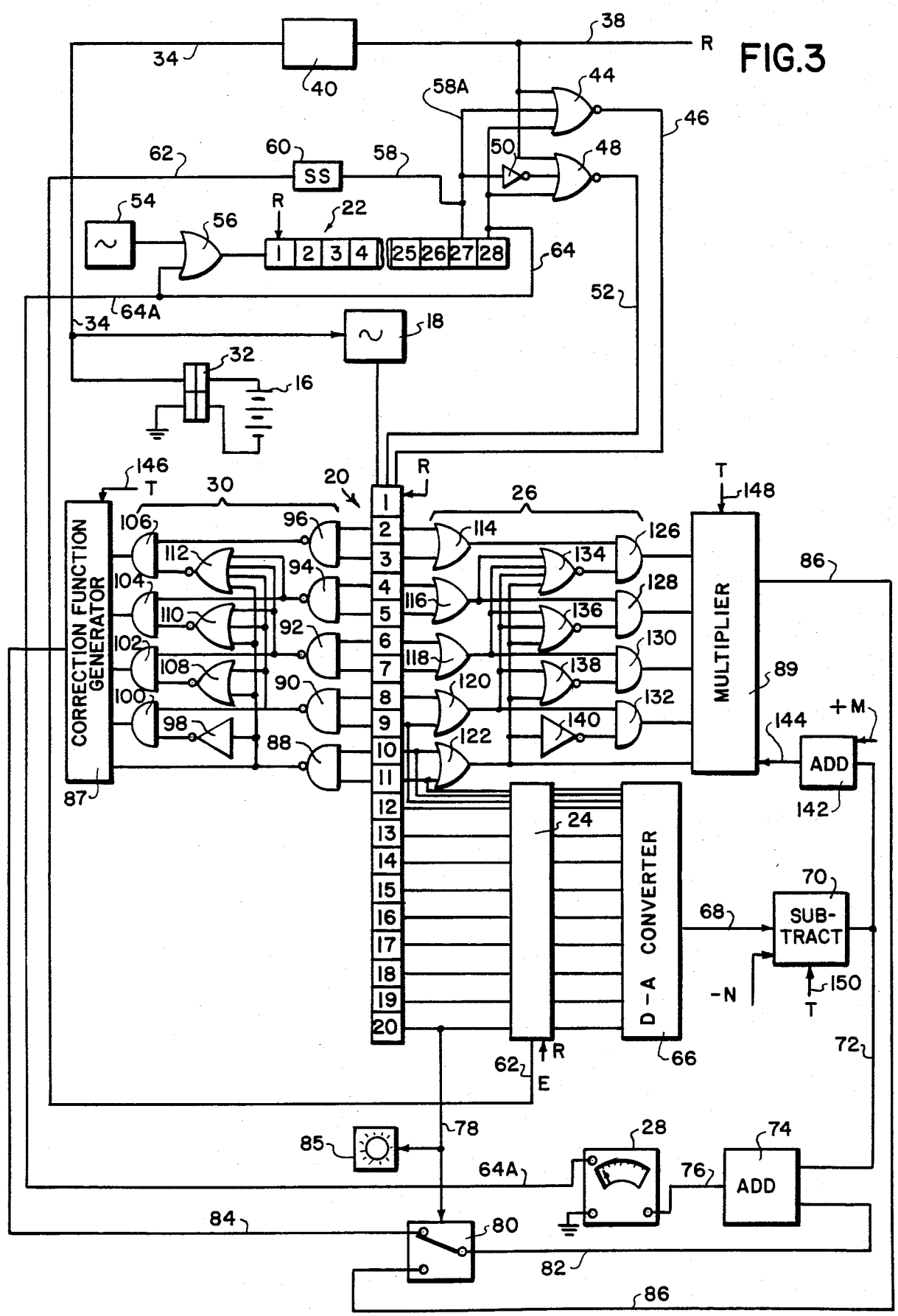
FIG. 3 is a schematic circuit diagram illustrating one preferred apparatus for carrying out the invention and employing a fixed interval of time between two different voltage measurements.

FIG. 3 is a schematic circuit diagram illustrating a preferred embodiment of apparatus in accordance with the invention for carrying out the method according to the invention. The apparatus can be very briefly described as follows:

The battery for which the state of charge is to be determined is schematically illustrated at 16. The battery 16 is connected to a voltage controlled oscillator 18 which is connected to a counter 20. The counter 20 is caused to count up for a predetermined fixed interval of time, as determined by a clock counter 22, to record a measurement of the battery voltage in digital form in terms of the count stored in the counter 20. Since the oscillator frequency is a function of voltage, the pulse count over a fixed interval is a function of voltage. The higher order digits of that count are then transferred to a register 24 for storage of the first voltage measurement for future use, and the counter 20 is then reversed to count down during a second voltage measurement interval the same fixed time duration. At the end of the countdown interval, the remainder within the counter 20 indicates the difference in voltage as measured by the two different measurements, such difference remaining in the lower order registers of counter 20. If the remainder in register 20 is positive, indicating a negative change in the voltage from battery 16, such positive remainder is analyzed by a digital logic network 26, and the result is used to modify the voltage value as stored in register 24, as will be described in more detail below, to provide a registration on a display meter 28 which indicates the state of charge of the battery 16. The negative change indicates a prior active condition of charging the battery.

On the other hand, if the remainder in the lower order registers of counter 20 is negative, indicating a rise in the second voltage measurement over the first voltage measurement, that condition is detected and analyzed by a digital network 30 which provides a different set of corrections to the voltage value stored in the register 24 for indication on the output meter 28 for the state of charge of the battery. The positive change indicates a prior active condition of discharging the battery.

The circuit of FIG. 3 is described in more detail as follows:

The apparatus is started by connecting the battery to the circuit by a connector schematically indicated at 32 which applies a logical 1 through connection 34 to a delay circuit 40, which may be a "single-shot" monostable multivibrator circuit. Delay circuit 40 is immediately "set" to provide a logic 1 output at connection 38 for reset purposes as indicated by the symbol "R". The reset signal is applied to reset each of the counters 20, and 22, and the register 24. Simultaneously, power is supplied to all of the components of the circuit, permitting those components to stabilize in a condition ready for operation. While other power supplies may be provided in the apparatus, it is assumed that the apparatus will be powered by the battery being tested. Voltage dropping and voltage stabilizing circuits will normally be connected in line 34 for this purpose.

After a brief delay, as determined by delay circuit 40, that circuit resets and removes the logic 1 output at connection 38. This results in a logic zero output, terminating the reset signal on connection 38, and providing a logic zero signal to a NOR gate 44. The other two inputs to NOR gate 44 are already logic zero since they are the outputs from the 27th and 28th stages of the timing counter 22, which has just been reset. Accordingly, the NOR gate 44 provides a logic 1 output at connection 46. The signal on connection 46 is supplied to counter 20 as a "countup" enabling signal, causing the counter 20 to commence its upward count in response to pulses from the voltage controlled oscillator 18. A NOR gate 48, which is similar to the NOR gate 44, is connected to receive the identical inputs supplied to NOR gate 44, except that an inverter 50 is provided between the output of stage 27 of timer counter 22 and the corresponding input of NOR gate 48. Therefore, at this time, NOR gate 48 is supplied with a logic "1" input from inverter 50 and continues to have a logic zero output on the output connection 52. The connection 52 provides a count down enable signal to counter 20 when it later goes to a logic 1. Substantially concurrently with the commencement of the count up operation of counter 20, the timer counter 22, having also had the reset signal removed, commences a count up operation under the control of a timer oscillator 54, which provides timing signals through an OR gate 56.

At the end of the initial timing interval, during which counter 20 counts up, a logic 1 appears at the output of the 27th stage of timing counter 22, which accomplishes three different functions. One of these functions is accomplished through a control circuit including connection 58, single shot 60, and connection 62 to the enable input of the register 24 to transfer the value stored in counter 20 into that register. That stored value is an indication of the first voltage value measured. Another function is the disablement of NOR gate 44 by the logic 1 supplied through connection 58A to that NOR gate, to discontinue the count up of counter 20. The third function is the enablement of NOR gate 48 by means of the logic 1 supplied to the input of inverter 50, which is then inverted to logic zero, to provide the logic 1 output from NOR gate 48 as the countdown enablement signal to counter 20 through connection 52.

After a countdown interval equal to the previous count up interval, the timer counter 22 counts up again until stage 27 of the timer counter 22 again goes to logic zero and stage 28 goes to logic 1. The logic 1 output from stage 28 disables the NOR gate 48, and maintains the disablement of NOR gate 44 so that the counter 20 continues to hold and store the difference value achieved in the count up and subsequent countdown operations. Furthermore, a measurement completion signal is supplied from the output of stage 28 of counter 22 through a connection 64 to a second input to OR gate 56 to lock that OR gate so as to discontinue further transmissions of pulses to the timer counter 22. The completion signal is also supplied through a connection 64A to enable the output meter 28 to thereby provide a visual indication to the operator of the state of charge of the battery. That state of charge is computed by the remaining circuit components which are about to be described below.

Since the first counting up of timer counter 22 and the second counting up of timer counter 22 occur in an uninterrupted sequence, the resultant counting up and counting down of the voltage measurement counter 20 occur in two adjacent time intervals. This provides two time-spaced voltage measurements. The difference between the voltage measurements in the two adjacent time intervals represents the equivalent of two different instantaneous voltage measurements spaced apart in time by the equivalent of the time from the middle of the first voltage measurement interval to the middle of the second voltage measurement interval. If desired, the voltage measurement intervals can be separated to provide a greater voltage change. This would require only a minor modification of the circuit as shown.

There is a substantial advantage in accumulating the counts for the voltage measurements over finite intervals of time. It provides an averaging effect which minimizes any small aberrations or fluctuations in battery terminal voltage. It is obvious, however, that other methods of measurement could be employed, such as taking substantially instantaneous voltage measurements and storing those voltage measurements in sample and hold circuits, and then subtracting one from the other.

It has been discovered that it is possible to rather simply derive signals in conformity with the battery characteristics illustrated in FIG. 2 which, on the basis of the voltage measurement stored in register 24 and the voltage change detected in the lower stages of register 20 by the logic networks 26 and 30, determine the battery state of charge in terms of a predicted ultimate steady state terminal voltage value. This can be simply done by computing and adding a factor to the voltage measurement stored in register 24 which is determined on the basis of the voltage change as detected by the logic networks 26 and 30.

The digital quantity stored in register 24 is first converted from digital form to an analog voltage in a digital to analog converter 66. This voltage represents the full terminal voltage of the battery. Since the steady state terminal voltage of the battery does not go to zero when the battery is discharged, a zero offset must be introduced at some point in the system so that the meter 28 will read zero for a discharged battery and full scale for a fully charged battery (or vice versa). The zero correction is preferably adjustable, since the determination of the terminal voltage which is to be regarded as indicating a fully discharged condition is partly a matter of judgment and preference. However, a typical stabilized votage per cell for a fully discharged battery is 1.969 volts, and a typical stabilized voltage per cell for a fully charged battery cell is 2.131 volts. In the present system, it is preferred to work with the zero corrected measurement voltage in further processing of the signals. Accordingly, a fixed factor N, corresponding to the stabilized "empty" voltage per cell, is subtracted from the output signal from converter 66 at 68 in a subtract circuit 70. The analog signal voltage at 68, and the factor N signal are preferably scaled down from the typical actual terminal voltage to provide for a full scale reading on meter 28 (after further correction) for a fully charged battery, and a zero reading for a fully discharged battery. The scales and voltages may be selected, for instance, to provide one volt at meter 28 to indicate 100% charge. The subtract circuit 70 may be simply carried out by means of an amplifier with the inputs combined in a resistor network so that the voltage output is offset by the amount of the subtracted offset signal N.

The offset corrected signal is supplied on a connection 72 to an analog add circuit 74, where a correction is added through a connection 82 based upon the detected change in the voltage to the second voltage measurement. The corrected signal is then supplied from the adder 74 through connection 76 to the meter 28. Add circuit 74 may also consist of an amplifier with a resistance network to combine the two input signals at a common amplifier input.

If the two successive voltage measurements indicate a negative remainder in counter 20 (indicating a rising terminal voltage), then the correction to be applied at the adder 74 is determined by the logic network 30. This rising terminal voltage condition indicates a last previous non-quiescent status of the battery in the discharge mode. This refers back to the curves 6A through 11A, and 14A, of FIG. 2. The negative remainder condition in counter 20 is characterized by having the counter go into the complement mode, in which, after having counted down to zero, all of the stages of the counter are shifted to the "one" state, and then counted down in the complement mode. This complemented condition is recognized and used by detecting a 1 output from the 20th stage of counter 20 on a connection 78 to a visual indicator 85 and to an electronic switch 80.

For some purposes, it is only necessary that the operator be informed as to whether the battery was previously in the charge mode or in the discharge mode. The signal to the visual indicator 85 (shown as a lamp) provides the information that the battery was last in the discharge mode. Another visual indicator also could be provided to indicate the opposite situation where the battery was last in the charge mode. When no further information is required, the remainder of the system, not yet described, may be omitted, along with all of the other components connected to receive, directly or indirectly, the outputs from the various stages of counter 20. However, in this description, it is assumed that a quantitative reading of battery charge is required.

Switch 80 determines whether the correction signal to adder 74 on input connection 82 is to be supplied from network 30 and a function generator 87 on connection 84, or from network 26 and a function generator 89 on connection 86. When a logic 1 signal is available at connection 78, the switch 80 is in the position shown to provide the correction signal on connection 84 from network 30 and a function generator 87 to connection 82 to the adder 74. In the absence of a logic 1 signal on connection 78, the switch 80 is switched to the other position to receive the correction signal through connection 86 from logic network 26 and a function generator 89. Switch 80 is a schematically illustrated electronic switch.

The logic network 30 is designed to provide a stepwise indication of the value of the remainder in counter 20. It has been discovered that stepwise corrections, with a reasonable number of steps, provide sufficient accuracy in the correction factor applied to the voltage to be indicated at indicator 28. Since the counter 20 is a binary digital counter, the highest value step in the negative residue value, as indicated by logic zeros in the 10th or 11th stage of the counter is in the range from a count of 512 to 2047. Thus, starting at the count 512, the 10th stage first goes to zero, and starting at the count 2048, the 12th stage first goes to zero, and the 10th and 11th stages both go to ones. The condition of the highest count range, in which either of the 10th or 11th stages provides a logic zero output, is detected by a NAND gate 88, which provides a logic one in that condition. Similarly the range step from 128 to 511 is detected by the NAND gate 90, and other lower order steps are detected by NAND gates 92, 94, and 96. The steps are respectively in the value ranges from 32 to 127, from 8 to 31, and from 2 to 7. However, in each lower range, other logic is necessary to make sure that the range has not been surpassed. Thus, in the range from 128 to 511, as determined by stages 8 and 9, there must be an assurance that the count has not already exceeded 511 by checking for logic zeros in stages 10 and 11. Therefore, the signal from NAND gate 88 is supplied through an inverter 98 to an AND gate 100, which also receives the output from gate 90, so that, unless there is a logic zero output from NAND gate 88, indicating that the value has not yet exceeded 511, there can be no signal provided from NAND gate 90 through AND gate 100 for an indication of that step value. Similarly, additional AND gates 102, 104, and 106 are provided for each of the other lower order ranges which are controlled by NOR gates 108, 110, and 112 to indicate that no higher order stages of the counter 20 have flipped over to zero.

The correction function generator 87 receives any one of the five stepwise signals from the logic network 30, and converts each of those signals to an appropriate correction factor for addition at adder 74. A sixth correction factor is available from the correction function generator 87 if none of the five inputs is available. This is the condition which exists when the remainder stored in counter 20 is a count of minus 1, or is in the positive instead of the negative range. However, this correction factor is only effective at the count of minus 1, because the counter 20 is not in the complement state when the remainder is positive. As explained previously, the counter 20 must be in the complement state in order to enable the switch 80 to obtain a correction from the correction function generator 87. At any rate, when the remainder in counter 20 is negative (in the complement mode) and at the smallest measurable count of minus 1, this sixth value from the correction function generator 87 is available at the output of that generator on connection 84.

Expressing the corrections in percent of full charge, it has been determined that appropriate and typical corrections to be applied at the adder 74 from the function generator 87 in response to the detection of residual count ranges from the counter 20 are as follows for a typical lead acid cell:

TABLE 1

| Range of Residue Count | Add Following Percent |
| --- | --- |
| −1 | 4 |
| −2 to −7 | 8 |
| −8 to −31 | 11 |
| −32 to −127 | 14 |
| −128 to −511 | 17 |
| −512 to −2047 | 20 |

In the above table, the corrections are given in percent. In terms of voltage, if a one volt output is used to indicate 100% charge, the values in the right column in the above table correctly indicate hundredths of a volt to be added in the adder 74.

As a specific example which ties in the above Table 1 values and the operation of the circuit of FIG. 3 with the curves illustrated in FIG. 2, attention is directed to curve 7A for the recovery from a discharge condition in a 30% charge state. The beginning of that curve, at 0.1 hours after quiescence begins is at a value of 14 on the zero corrected percent of charge scale. Thus, the zero corrected output from subtractor 70 would be 0.14 volts. The rate of change detected at 0.1 hours would be in the range of counts in Table 1 at the step of −128 to −511. Therefore, the correction voltage provided by the correction function generator 87 would be 0.17, which when added to the previous value of 0.14 in the adder 74 provides 0.31 volts, which provides a close approximation to a 30% charge reading on meter 28.

It will be apparent that the correction values given above for the stepwise voltage measurement residue counts essentially represent approximate antilogarithmic functions of the residue counts. While a greater number of steps could be taken to provide greater precision, or a continuous computation could be made, it has been discovered that these stepwise approximations are adequate for providing a measurement within the limits of accuracy within the apparatus. The relationships stated in the above Table, together with the zero corrected voltage measurement available from subtractor 70, represent a means for matching the data plotted in FIG. 2 for the recovery curves from a prior discharge condition within this apparatus for computing the state of charge. The correction factors shown in the above Table 1 for the different steps have been selected to match with the slopes of the curves for a particular battery. A different table of correction factors can be selected for a different battery.

The correction function generator 87 can be carried out in various ways which are known to the art. For instance, the five logic network 30 outputs may control five electronic switches which connect different voltages from different parts of a voltage divider network to the output connection 84 to be added into the adder 74.

To produce the above mentioned counts in counter 20 in the apparatus of FIG. 3, when it is designed to operate with a battery 16 with a nominal 36-volt rating, the voltage controlled oscillator 18 may be selected to produce 34,293.55 counts per minute per volt. If greater resolution is desired on the low end of the scale, an oscillator which operates at a higher frequency per volt may be employed, with appropriate adjustments of the correction functions supplied from the correction function generator 87. Greater resolution can also be achieved by designing the circuit to provide for an accumulation of the counts over longer timing intervals than one minute, or by time separation of the two timing intervals.

Logic network 26 operates on principles similar to network 30 to respond to a positive residual in counter 20. The positive residual indicates that the battery was last in a prior charge condition, and an appropriate voltage correction signal is needed. However, the situation is complicated by the fact that the slopes of the recovery curves from the prior charge condition are not perfectly uniform. Thus, the slopes are greater for higher conditions of charge, and lower for lower conditions of charge.

Again, five different steps of count values are detected corresponding to the count values discussed above in connection with the network 30. For this purpose, network 26 includes a series of five OR gates 114–122. OR gate 122 detects the condition where the residual count is in the range from 512 to 2047, and provides that signal as one of the input signals to function generator 89 which may be a variable gain amplifier. Thus, if the count is high enough so that either the 10th or 11th stages contain a binary 1, the OR gate 122 provides an output to the variable gain amplifier 89. In a similar manner, each of the OR gates 114–120 indicates the presence of a binary 1 in either one of a connected pair of stages of the counter. For each of the lower order steps, AND gates 126–132 are respectively provided to exclude the condition that higher order binary 1 digits exist. For this purpose, NOR gates 134–138, and an inverter 140, are provided. For instance, for a true indication for the second step by means of an output from AND gate 128, not only must there be a binary 1 in the 4th or 5th stage to provide a binary 1 output from OR gate 116, but there must not be a binary 1 output from any of the higher order OR gates 118, 120, and 122, as detected by the NOR gate 136, so that NOR gate 136 will continue to provide a logic 1 to AND gate 128.

In order to correct for the varying slopes of the battery voltage recovery from charge curves 1A–5A of FIG. 2, the corrections provided from the variable gain amplifier 89 are determined partly by the level of the voltage measured and stored in register 24. This is accomplished by providing the zero corrected output signal on connection 72 to the variable gain amplifier 89 through an adder 142. In the adder 142, a fixed signal M is added. It has been found that an appropriate constant M to be added corresponds to 50% of the full scale full charge signal. This is the signal indicated at the second input to adder 142. Adder 142 may be implemented by an amplifier with a resistor summing network for summing the two inputs. The output from adder 142 at connection 144 to the variable gain amplifier 89 is then amplified in the amplifier 89 by a selected one of five different amplification factors, determined by the step detected by the logic network 26. The resultant signal is then supplied through connection 86 to switch 80 and thus through connection 82 to the adder 74 for correction of the voltage to be supplied to the meter 28. Actually, the variable gain amplifier 89 is operable, in the absence of any one of the five inputs from network 26, to provide a predetermined small variable gain in recognition that the remainder value stored in register 20 is either zero or 1, and therefore the slope is so low that it is considered to be indeterminate. If desired, a sixth input can be provided to the variable gain amplifier 89 from the first stage of the counter 20, and that stage can be used to provide another gain factor different from any factor provided with a zero count.

For the battery which data is plotted in FIG. 2, the multiplication factors (amplification factors) provided by the variable gain amplifier (multiplier) 89 for the various different residue counts are preferably as shown in the following table:

TABLE 2

| RANGE OF RESIDUE COUNT | MULTIPLICATION (AMPLIFICATION) FACTOR |
| --- | --- |
| 0 to 1 | −0.07 |
| 2 to 7 | −0.137 |
| 8 to 31 | −0.165 |
| 32 to 127 | −0.194 |
| 128 to 511 | −0.218 |
| 512 to 2047 | −0.242 |

By computing the correction to be applied to the voltage measurements from the register 24 in the manner described above, applying an offset signal in adder 142, and then accomplishing an effective signal multiplication by means of the variable gain amplifier 89, it has been found that a very close approximation can be achieved to an accurate prediction of the ultimate steady state quiescent voltage on the basis of the recovery terminal voltage characteristics from a previously charged condition, as illustrated in curves 1A through 5A of FIG. 2. The factoring in of the voltage level measurement supplied through the adder 142 provides for a recognition of the fact that the slopes of the curves 1A through 5A are not parallel, and that the variation of slope is a function of the voltage level.

A specific example will serve to illustrate the operation of the circuitry just described. Assuming that the condition is one of 100% charge, and that the battery has just been on charge 0.1 an hour earlier, the applicable curve on FIG. 2 is curve 1A, and the applicable point on curve 1A is the beginning of that curve at the left of the diagram, indicating a zero corrected voltage in terms of 148% of full charge. This means that the output from the subtract circuit 70 in FIG. 3, which applies the zero correction, will be 1.48 volts. The adder 142 adds 0.5 volts to provide a total of 1.98 volts at connection 144 at the input to amplifier 89. Since the maximum slope condition will have been detected, the multiplication factor from Table 2 will be −0.242, providing an output on connection 86 of −0.479 which is added (actually subtracted because it is a negative number) to the 1.48 volts in the adder 74 to provide a resultant voltage of just a trifle over 1 volt to the meter 28 as a correct indication of the full charge condition.

The computations are carried out by means of analog devices in FIG. 3. It will be quite apparent that digital logic could be easily employed, since the raw data from the counter 20 is in digital form, and since the logic networks 26 and 30 comprise digital elements. In a digital embodiment, the correction function generator 87 can be simply a "look up" table of values which are selected by the five inputs from the logic network 30. Similarly, the variable gain amplifier 89, in digital form, may simply comprise a multiplier with a "look up" table to select different multiplication factors. It will be apparent that the characteristics of the circuit could be easily changed by changing the "look up" tables in the correction function generator 87 and the variable gain amplifier 89. The adders 74 and 142, and the subtractor 70, are replaced by digital devices, and the digital-to-analog converter 66 is omitted. It will also be understood that, particularly in a digital version, an appropriately programmed microprocessor, with associated working memory, can be employed to carry out the functions of the system, with a minimum of special dedicated components.

The voltage recovery curves illustrated in FIG. 1 and FIG. 2 assume a substantial prior energy transfer between the battery and another device. For instance, those curves assume a normally heavy load applied for an interval of at least several minutes, or a normally heavy charge current applied for at least five minutes or so. Thus, a very brief interval of regenerative braking, or a very brief application of a normal load, or the application of a very light load for a longer interval, will not result in the substantial deviations of terminal voltage from the ultimate steady state voltages illustrated in FIGS. 1 and 2. Consequently, the voltage recovery curves after such minor current exchange incidents will not be as steep. Therefore, the battery will appear to be closer to its steady state condition at the outset of the quiescent condition. It is one of the features and advantages of this invention that since the rate of change of the voltage is being measured, as well as the absolute value of the voltage, an accurate indication of the state of charge is obtained even though the prior current exchange incident was a relatively minor one. Thus, the method and apparatus automatically compensate for differences in the recovery curves caused by differences in the magnitude of the prior energy transfer. However, the compensation may not be exact.

The invention also tends to automatically compensate for variations in the temperature of the battery for battery systems in which changes in voltage fluctuations caused by changes in temperature are accompanied by similar changes in the voltage recovery characteristics. For instance, in such a system, under load, the terminal voltage will decrease more when the battery is cold. However, the voltage recovery curve will also present a steeper slope, and the battery will look to the system as though it is simply at an earlier stage in the recovery towards a steady state condition compared to operation at normal temperature.

However, it may be desirable to provide for specific modifications of the operation of the apparatus in response to temperature variations. While not illustrated in detail, the embodiment of FIG. 3 may incorporate a temperature sensing device to sense the temperature of the battery 16 and to modify the operation of the circuits in accordance with that sensed temperature. If the temperature is higher than normal, the battery becomes more electrochemically active, and if the temperature is lower than normal, the battery becomes less electrochemically active, modifying the voltage characteristics depicted in FIG. 2. In order to recognize changed conditions due to changes in temperature, a temperature signal derived from a temperature sensor at the battery 16 may preferably be applied, as indicated at 146 and 148 to the correction function generator 87 and to the variable gain amplifier 89, and as indicated at 150 to the subtract circuit 70. The temperature correction input to the subtract circuit 70 at 150 will change and adjust, on a continuous, or in a stepwise manner, the offset correction of the voltage value derived from the number stored in register 24. The temperature correction at 146 to the correction function generator 87 will modify the correction functions selected by each of the five inputs to the correction function generator 87 from network 30. This modification may likewise be on a continuous, or in a stepwise manner. In a digital embodiment, the detection of a temperature above or below certain limits may simply switch in a new "look up" table of values to be selected by the five inputs. In a similar manner, the temperature correction input at connection 148 may select different variable gain values for the amplifier 89.

FIG. 3 illustrates an embodiment of the invention in which two voltage measurements are made at a fixed time separation, and the voltage difference over the fixed time is used to derive a correction to the total voltage amplitude measurement. However, another very useful procedure is to look for a voltage change of a predetermined fixed amplitude, while measuring the variable time to achieve that voltage change, and then using that time measurement to derive the appropriate correction.

Figure 4:
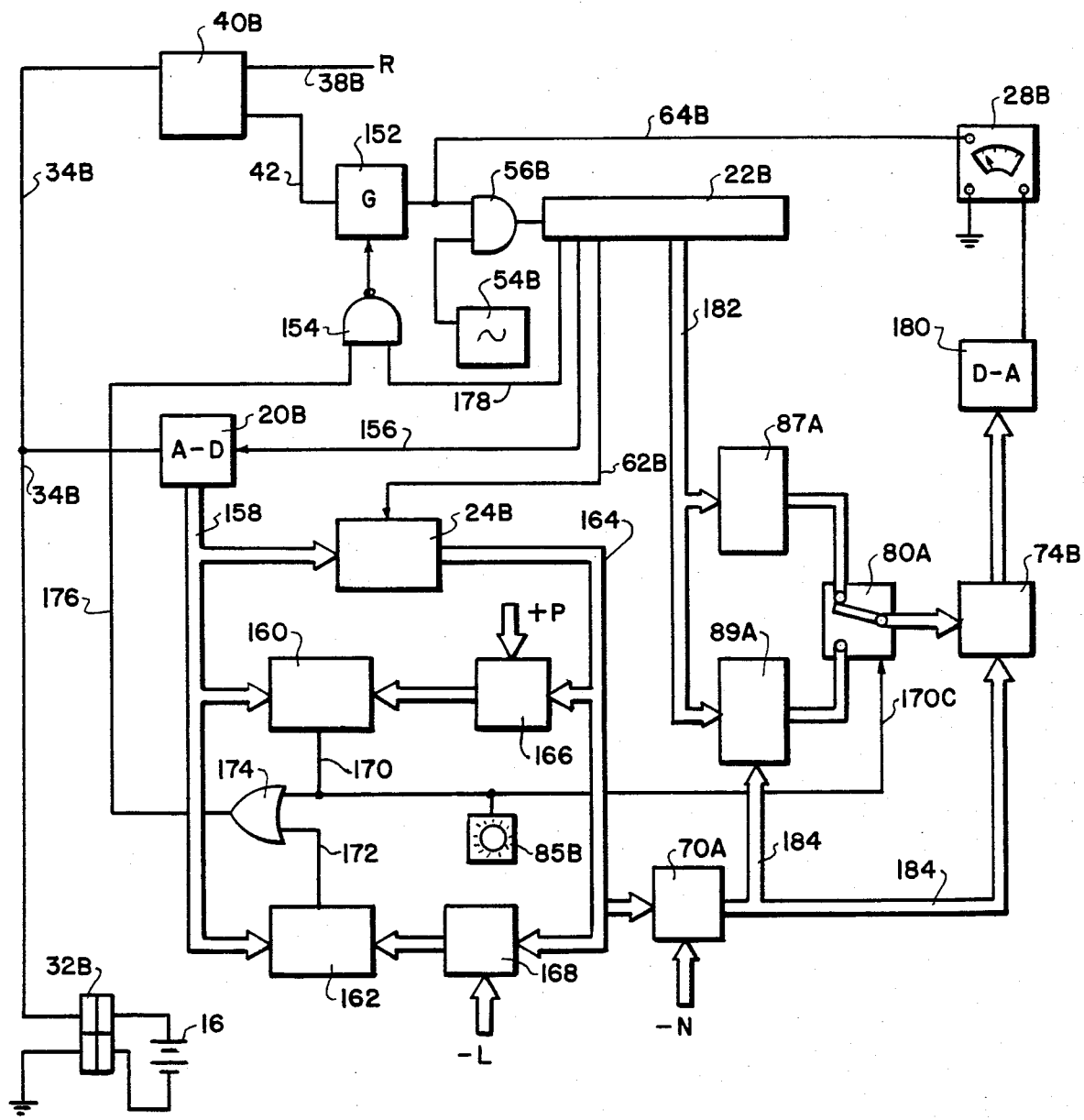
FIG. 4 is a schematic circuit diagram of another preferred apparatus for carrying out the invention in which a variable time interval is measured for the achievement of a predetermined voltage difference between two voltage measurements.

FIG. 4 is a schematic circuit diagram of another embodiment of the invention in which the time between a first voltage measurement and a second voltage measurement is variable, and is measured, until a predetermined voltage difference is achiieved. The elapsed time is then used as a quantity for calculation of the appropriate correction for prediction of the steady state open circuit voltage and the determination of the state of charge.

In the embodiment of FIG. 4, components which are substantially identical to corresponding components in FIG. 3, or which perform similar functions, are given the same numbers as used in FIG. 3, but with the suffix letter B. The apparatus of FIG. 4 is preferably started when it is connected to the battery 16 by a connection device 32B, which may be of conventional construction. This results in the application of battery terminal voltage at connection 34B to an analog-to-digital converter 20B, and also to a delay circuit 40B, which may be a monostable multi-vibrator, sometimes referred to as a "single-shot" circuit. Delay circuit 40B is immediately "set," providing an output on connection 38B to reset all of the components of the circuit, the individual reset circuits not being illustrated. The setting of the delay circuit 40B initiates the timing of a delay interval, at the end of which the delay circuit resets, thus terminating the reset signal at 38B. Reset of delay circuit 40B also makes available a delayed signal on connection 42B which is supplied as an input to a gate 152, which is normally enabled by a NAND gate 154 to provide an output at connection 64B. The output at 64B disables the display device 28B, and enables an AND gate 56B. The enablement of AND gate 56B gates clock signals from a clock oscillator 54B into a counter 22B which serves as an elapsed time indicator, and also as a clock commutator control for the operation of the system.

The analog-to-digital converter 20B may be carried out in various ways. In one embodiment, it may include the voltage responsive variable frequency oscillator 18 of FIG. 3, the counter 20 of FIG. 3, and a timer such as counter 22 of FIG. 3 or it may employ timing connections (not shown) to the existing counter 22B of FIG. 4. At any rate, the analog-to-digital converter 20B is capable of taking the voltage signal available from battery 16 and converting that voltage signal to a digital quantity from time to time when enabled by a control signal pulse on connection 156 from the commutator control 22B. That digital quantity is then available on a data bus 158 to a storage register 24B and to two comparator circuits 160 and 162.

After the first analog-to-digital converter control pulse on connection 156, the commutator control 22B issues an enablement control pulse on a connection 62B to the register 24B, causing that register to read the number available upon the data bus 158 from the analog-to-digital converter 20B. That quantity, corresponding to the first voltage measurement, then remains stored in register 24B for the remainder of the operation of the apparatus for obtaining a particular reading at meter 28B. No more enabling pulses are emitted on connection 62B to register 24B during that operation of the apparatus. Accordingly, the quantity stored in 24B remains the same, and that quantity appears and continues to be available on an output bus 164.

The quantity appearing on the output bus 164 is incremented by a fixed factor P in an adder 166, and is compared in comparator 160 with new voltage readings from the analog-to-digital converter 20B appearing on bus 158. Concurrently, the first voltage reading quantity appearing on bus 164 is decremented by a fixed factor L in an adder 168, and is compared in comparator circuit 162 with the new voltage readings from the analog-to-digital converter 20B. The comparator 160 is operable to provide an output at an output connection 170 as soon as the condition is detected in which the latest number appearing on bus 158 from the analog-to-digital converter (representing the latest voltage reading) exceeds the incremented number from adder 166. This condition indicates a substantial match with a second point on one of the rising battery terminal voltage characteristics 6A, 7A, 8A, 9A, 11A, and 14A of FIG. 2. Similarly, comparator 162 is operable to provide an output signal on connection 172 when it first detects that the number on bus 158 is less than the number on bus 164 as decremented by factor L in adder 168. This is the condition which indicates a match with a second point on one of the decreasing voltage characteristic curves 1A–5A.

The factors P and L each represent a fixed voltage difference between a first reading and a second reading which is to be detected by the compare circuits 160 and 162. P and L may be equal in magnitude, but not necessarily. The negative slope curves 1A through 5A have a greater slope than do the positive slope curves 6A et seq. Therefore, the factor L, which is used to recognize negative slopes, may be selected to be somewhat smaller than the factor P which is used to recognize positive slopes, since a significant measureable value will be available in a shorter time with the negative slopes. On the other hand, if it is desired to have the remainder of the circuits work in a more symmetrical manner, with similar elapsed times being used for corrections, then L may be selected to be larger than P, so that the times to achieve the fixed change in voltage may be comparable for the negative slope curves and the positive slope curves.

If either of the outputs on 170 or 172 from the comparators 160 and 162 is available, then the OR gate 174 is activated to provide a logic 1 output signal on connection 176 as an input to NAND gate 154. NAND gate 154 is also provided with a clock signal on connection 178 after each operation of the analog-to-digital converter 20B. Accordingly, as soon as an operation of the analog-to-digital converter 20B results in an output from one of the comparators 160 or 162, the next succeeding commutation signal to NAND gate 154 on connection 178 results in a logic zero output from NAND gate 154. This disables gate 152, resulting in the disablement of AND gate 56B so as to stop counter 22B. The disablement of gate 152 also removes the disablement signal on connection 64B to the meter 28B, so that the apparatus may indicate the state of charge.

The state of charge is derived from the circuitry now to be described. The initial voltage measurement number appearing on bus 164 is supplied to an adder 70A. In adder 70A, a factor N is subtracted from the number to provide the "zero" correction so that the meter 28B may read on an expanded scale basis to show zero for fully discharged and full scale for fully charged. The quantity from adder 70A is then transmitted to an adder 74B which provides a correction function based on the voltage difference measurement. That function is added through data switch 80A. After the addition of that correction function, the data is transferred to a data converter 180 to convert the data to a form which is usable by the meter 28B. The data converter 180 may be a digital-to-analog converter if the meter is an analog meter, as shown, or the converter 180 may be a digital converter for converting the data to a digital form for use by an indicator. Such a form may be a seven segment code for energizing a decimal digit readout device, or a one out of N code converter for providing a digital display which simulates a moving pointer.

The correction factors provided through switch 80A are from correction transform circuits 87A and 89A, and are based upon elapsed time measurements available from the elapsed time counter 22B on a bus 182. Recognition of whether the curve matching by the operation of the comparators 160 and 162 was accomplished for a positive voltage difference by comparator 160, or for a negative voltage difference by comparator 162, is accomplished by means of an extension 170C of the output line 170 from the positive comparator 160 to switch 80A. The resultant enablement of the switch 80A causes the switch to connect the positive correction transform device 87A through to the adder 74B. Otherwise, the switch 80A is normally in the position to connect the negative transform circuit 89A to the adder 74B. It will be appreciated that switch 80A is only schematically shown, as it will typically be an electronic digital switch which may include a number of logic gates.

Since the characteristics, as plotted in FIG. 2, are substantially logarithmic functions of time, the correction transform circuits 87A and 89 each generate signals which are representative of an inverse anti-logarithmic function of the elapsed time from the first measurement to the second measurement. The elapsed time signal is supplied on connection 182 to each of these transform circuits. The function generated by each transform circuit is an inverse function because a greater elapsed time required for the predetermined voltage difference to develop indicates that the battery has been in a quiescent state for a longer interval, and it's closer to the steady state open circuit condition so that a smaller correction is required to provide the correct output.

As explained in connection with FIG. 3, since the negative slope curves 1A et seq have different slopes, at different states of charge, that situation must be accommodated by providing the zero corrected first voltage reading number from the adder 70A through connection 184 to the correction transform circuit 89A so that the voltage level may be factored in with a computation comparable to that carried out with the adder 142 and the variable gain amplifier 89 of FIG. 3.

The lowest order stages of the counter 22B may be used for the clock commutator control of the operations of the converter 20B by the timing pulse on connection 156, and for testing to see if a comparison output is available by means of the timing pulse on connection 178 to the NAND gate 154. Thus, each time the counter 22B is incremented, a new comparison may be made and checked. However, since time is essentially a logarithmic function in the curves which are to be matched, as the elapsed time becomes longer, it is not necessary to have equally time spaced tests for comparison. Furthermore, if the timing counter 22B is made to count up in a logarithmic progression of counts, then the output at bus 182 to the transform circuits 87A and 89A is an antilog function, and the transform function circuits may then be simplified. Accordingly, an alternative arrangement for the circuit of FIG. 4 is to provide for a logarithmic time function advance of the counter 22B. This can be accomplished in various ways by providing for progressively increasing time spacing between successive pulses from the clock 54B. One very useful method is to provide a pulse divider circuit between the clock oscillator 54B and the AND gate 56B in which the division factor is variable and controlled by the accumulated count in the counter 22B.

In the system of FIG. 4, temperature may be measured, and temperature compensation signals incorporated, as discussed above in connection with FIG. 3. However, the temperature compensation input signals are not indicated in FIG. 4.

The embodiment of FIG. 3, in which the voltage difference is measured over a fixed interval of time, provides the best results when used in the earlier portions of the quiescent battery interval when the voltage changes per unit of time are high. The embodiment of FIG. 4, in which the time is measured for a predetermined fixed change in voltage, provides better resolution when the test is made later in the quiescent interval when the changes in terminal voltage are less rapid. If the FIG. 3 embodiment is used in the low slope regions of the quiescent interval, the difference in voltage over the fixed interval of time may be so small that it is very difficult to measure. On the other hand, the system of FIG. 4 provides less resolution in the steep slope operating regions.

In one useful modification, the systems of FIG. 3 and FIG. 4 may be combined, the operation of both systems being started simultaneously. If, at the end of the fixed time interval, the difference voltage detected by the remainder in counter 20 of the FIG. 3 system is very small, or not measurable, then the system of FIG. 4 is operable to measure for a fixed voltage difference over a variable time interval. In this manner, a combined system makes use of the advantages of both of the systems of FIGS. 3 and 4. In such a combined system, each of the individual systems of FIGS. 3 and 4 preferably operate independently of one another, and preferably share a common output meter, with simple logic gates which permit only the first of the two systems which comes up with a meaningful output to take possession of the output meter and place its output on that meter. In the instance given above, where the remainder in counter 20 of the FIG. 3 system is very small, or not measurable, then the system of FIG. 3 would lock itself out so that only the system of FIG. 4 would ultimately register an output on the meter.

In such a combined system of FIGS. 3 and 4, it is also possible to select a fixed time interval for the FIG. 3 portion of the combined system, and a fixed voltage difference for the FIG. 4 portion of the system such that there will be instances during very high curve slope detection when the fixed voltage difference condition will be satisfied before the fixed time interval has elapsed. In this instance, the FIG. 4 portion of the combined system will take possession of the output meter to the exclusion of the FIG. 3 portion. The advantage of such a system is that a reading is obtained very quickly.

In still another modification, two sets of FIG. 3 apparatus may be employed, having two different fixed time intervals. If, at the end of the shorter fixed time interval, the difference voltage detected by the remainder in counter 20 is very small, or not measurable, then the second FIG. 3 apparatus, providing a longer time interval, is switched in and becomes operative. In this same manner, more than two fixed time intervals may be employed until a reading of sufficient significance is obtained.

In the description of the systems of both FIGS. 3 and 4, two voltage measurements are made, the voltage difference is measured, and the state of charge is computed on the basis of the first of the two voltage measurements together with the voltage difference. It will be quite apparent that it is possible to compute the state of charge based upon the voltage difference plus the second voltage measurement, since the value of the voltage does not change significantly except in terms of the difference measurement.

Furthermore, the description of the invention is given entirely in terms of measuring a single voltage difference between one pair of points in time. It will be apparent, however, that the method and apparatus of the invention can be easily expanded to provide for a series of measurements of voltage differences, and for crosschecking from one voltage difference measurement to another to verify the correctness of the measurements in order to enhance the accuracy.

As stated above, both of the embodiments of FIGS. 3 and 4 are schematic representations. It will be understood that additional components such as logic gates may be desirable in order to refine the operations of these circuits and to prevent problems such as undesired back circuits. Also, power supplies, voltage scaling circuits, and other refinements are not shown.

It will be understood that the quiescent voltage recovery characteristics given in FIGS. 1 and 2 are typical characteristics for some lead acid system batteries. However, other batteries may display other quiescent voltage recovery characteristics, and adjustments in the functions provided by the function generators 87 and 89 of FIG. 3 may be made to accommodate to those other characteristics. In particular, if the other quiescent voltage recovery characteristics display a high degree of parallelism in the recovery from the charge mode, for instance, then a function generator similar to the function generator 87 may be used for the function generator 89, without the multiplication function. Similarly, if such other voltage characteristics provide a substantial divergence in the recovery curves from the discharge condition, then the correction function generator 87 may be replaced by a function generator similar to function generator 89, incorporating a multiplication function.

As explained above in connection with FIG. 3, the correction function generator 89 operates by multiplication of a factor corresponding to the voltage obtained from register 24 through digital-to-analog converter 66 after modification in the subtractor 70 and the adder 142. The subtractor 70 subtracts one factor, and the adder 142 adds another factor. Therefore, the signal at the output from adder 142 at connection 144 represents the voltage level signal, with what may be characterized as a "zero level adjustment," to provide a zero level adjusted value of the voltage level.

In FIG. 3, it was stated that when the remainder reading in counter 20 was either zero or 1, and thus too low to activate either of the logic networks 26 or 30, the remainder reading was regarded as being substantially indeterminate. While not illustrated in the drawing, it may be desirable to provide gates and a visual indicator actuated by such gates to indicate that condition to the operator, so that the operator will be aware that the accuracy of the instrument may be impaired by the low resolution reading.

In the operation of the system of FIG. 4, if the slope of the recovery curve is very low, as it is in the later stages of recovery, quite a long interval may be required to achieve the fixed voltage difference at which the second voltage measurement is taken. Accordingly, while not shown, a desirable added feature for the system of FIG. 4 is a time-out switching feature which causes the meter to register the zero corrected first voltage measurement supplied through the subtractor 70A, without the addition of a correction factor in adder 74B, after a considerable interval has elapsed without the achievement of the fixed voltage difference. This assumes that the slope of the recovery curve is so low that the difference between the first voltage measurement and steady state battery terminal voltage is inconsequential.

The above description of the operation of the system assumes that the battery is in good condition. However, if the condition of the battery is impaired, such that there is a weak or dead cell, for instance, the instrument will register a low charge condition. The fewer cells there are in the system, the lower the reading will be.

I claim:

1. A method for testing a battery which is in a quiescent condition comprising the steps of
taking a first battery terminal voltage measurement, storing said first measurement, taking a second terminal voltage measurement at a subsequent time, and comparing said second measurement with said first measurement to determine the direction of voltage change from said first measurement to said second measurement generating at least one signal indicating the direction of voltage change and providing a visual indication of the direction of voltage change to indicate whether the battery was last subjected to charge or discharge.

2. A method for testing a battery which is in a quiescent condition comprising the steps of taking a first battery terminal voltage measurement, noting said first measurement, taking a second terminal voltage measurement at a subsequent time, measuring the time interval from the first battery terminal voltage measurement to the second battery terminal voltage measurement and comparing said second voltage measurement with said first voltage measurement in relation to the time interval measurement to determine the rate of voltage change from said first voltage measurement to said second voltage measurement, and then using the combination of the value of one of said voltage measurements and the direction and the rate of voltage change to determine a quantity which is a function of a predicted steady-state open circuit voltage as a determination of the battery state-of-charge.

3. A method as claimed in claim 2 wherein said measured time interval between said first measurement and said second measurement is a fixed time interval.

4. A method as claimed in claim 3 comprising taking said first battery terminal voltage measurement by connecting a voltage controlled oscillator to receive the voltage to be measured and then counting the number of oscillations from the voltage controlled oscillator over a fixed interval of time, taking the second voltage measurement in the same manner, and then subtracting the counted number of oscillations for the second measurement from the counted number of oscillations for the first measurement to determine the direction and rate of voltage change from the first measurement to the second measurement.

5. A method as claimed in claim 4 wherein the oscillation count from the first voltage measurement is recorded and the oscillation count for the second voltage measurement is then later subtracted from the recorded first count.

6. A method as claimed in claim 4 wherein the voltage measurements and the subtraction of the counts are obtained by connecting a reversible counter to the voltage controlled oscillator and counting the counter up in response to the oscillations of the voltage controlled oscillator during the fixed time interval for the first voltage measurement, and then reversing the counter to count down during the fixed interval of time during the second voltage measurement so that any residue count remaining in the counter represents the difference between the two voltage count measurements.

7. A method as claimed in claim 3 wherein the following additional step is taken when said second measurement after a fixed time interval does not provide a difference from said first measurement sufficient for an accurate difference determination comprising subsequently taking another second voltage measurement at the end of a variable measured time interval after said first voltage measurement which is determined when a second voltage measurement is achieved which represents a predetermined fixed voltage difference from said first voltage measurement.

8. A method as claimed in claim 2 wherein said measured time interval from said first voltage measurement to said second voltage measurement is variable, with the end of said measured time interval being determined when a second voltage measurement is reached which represents a predetermined fixed voltage difference from said first voltage measurement.

9. A method as claimed in claim 8 wherein said predetermined fixed difference between said second voltage measurement and said first voltage measurement is different when the voltage difference is positive from when the voltage difference is negative.

10. A method as claimed in claim 8 or claim 9 wherein the end of said measured time interval is determined at the second voltage measurement which represents a fixed difference from the first voltage measurement by comparing successive voltage measurements with the sum of the stored first voltage measurement and a fixed difference voltage quantity to determine when one of the successive voltage measurements first more than matches the sum.

11. A method as claimed in claim 2 wherein the determination of the quantity which is a function of a predicted steady state open circuit voltage is based upon known battery terminal voltage recovery characteristics after a battery current exchange for the type of battery under test.

12. A method as claimed in claim 2 wherein the determination of the quantity which is a function of a predicted steady state open circuit voltage is carried out by adding a factor to one of said voltage measurements determined as a function of the rate of change between said voltage measurements.

13. A method as claimed in claim 12 wherein the factor determined as a function of the rate of voltage change is substantially an anti-logarithmic function of voltage change per unit of time.

14. A method as claimed in claim 12 or claim 13 wherein the factor determined as a function of the rate of voltage change is simply derived in a step-wise manner by determining into which range of a group of different voltage change rate ranges the rate of voltage change falls, and then employing a factor previously assigned for the determined range.

15. A method as claimed in claim 12 wherein the factor added to said one voltage measurement which is determined as a function of the rate of voltage change is a combined function of the rate of voltage change and the voltage level to match the prediction of steady state open circuit voltage to known battery terminal voltage recovery characteristics when the slopes of the voltage recovery curves vary for recovery from different voltage levels.

16. A method as claimed in claim 15 wherein the voltage level and the rate of voltage change are combined to produce said combined function by multiplying a signal quantity corresponding to a zero level adjusted voltage level by a factor substantially proportional to an anti-logarithmic function of the rate of voltage change.

17. A method as claimed in claim 2 wherein said second measurement is taken at a fixed time interval after said first measurement or at a fixed voltage difference from said first measurement, whichever occurs first.

18. A method as claimed in claim 3 wherein the following additional step is taken when said second measurement after a fixed time interval does not provide a difference from said first measurement sufficient for an accurate difference determination: taking another second voltage measurement at the end of a longer fixed time interval after said first voltage measurement.

19. Apparatus for testing a quiescent battery for determining the state of charge of that battery comprising means for taking battery terminal voltage measurements, means for storing a first battery terminal voltage measurement, means for comparing a second battery terminal voltage measurement taken at a subsequent time with said first battery terminal voltage measurement and operable to determine the direction of voltage change of said second voltage measurement from said stored first voltage measurement and to generate at least one signal indicating the direction of voltage change, and visual indicating means connected to said comparison means to receive said direction of voltage change signal for providing a visual indication of the direction of voltage change as an indication as to whether the battery was last subjected to charge or discharge.

20. Apparatus as claimed in claim 19 wherein said means for taking battery terminal voltage measurements comprises a voltage controlled oscillator and a digital counter connected to receive oscillation pulses from said voltage controlled oscillator for counting those pulses as a measurement of voltage, said means for comparing a second battery terminal voltage measurement taken at a subsequent time comprising means for reversing the operation of said reversible counter during said second battery terminal voltage measurement to count said counter in the reverse direction, and said means for comparing said second battery terminal voltage with said first battery terminal voltage measurement including means to determine whether or not said reversible counter is switched into the complement mode to indicate a negative remainder in said reversible counter as an indication of the direction of voltage change.

21. Apparatus for testing a quiescent battery for determining the state of charge of that battery comprising means for taking battery terminal voltage measurements, means for storing a first battery terminal voltage measurement, means for comparing a second battery terminal voltage measurement taken at a subsequent time with said first battery terminal voltage measurement, means for measuring the time interval from the first battery terminal voltage measurement to the second battery terminal voltage measurement, means for comparing said second voltage measurement with said first voltage measurement in relation to the time interval measurement to generate a quantity corresponding to the rate of voltage change from said first voltage measurement to said second voltage measurement, means connected to receive one of said measurements and said rate of voltage change quantity and operable to determine a quantity which is a function of a predicted steady-state open circuit voltage as a determination of the battery state-of-charge, and display means connected to said last-named means for display of said state-of-charge quantity.

22. Apparatus as claimed in claim 21 wherein said means for measuring said time interval is operable to measure a fixed time interval.

23. Apparatus as claimed in claim 22 wherein said battery terminal voltage measurement means comprises a voltage controlled oscillator connected to receive the voltage to be measured and a reversable counter operable to count the number of oscillations from the voltage controlled oscillator, said counter being operable to count in one direction over a fixed interval of time to take said first voltage measurement, said counter being operable to reverse to count in the other direction to make said second voltage measurement so that any residue count remaining in the counter represents the difference between the two voltage count measurements.

24. Apparatus as claimed in claim 21 wherein said means for comparing said second voltage measurement with said first voltage measurement is operable to determine a a second voltage measurement which represents a predetermined fixed voltage difference from said first voltage measurement.

25. Apparatus as claimed in claim 24 wherein said comparison means comprises a comparison circuit connected to compare successive voltage measurements with the sum of the stored first voltage measurement and a fixed difference voltage quantity to determine when one of the successive voltage measurements more than matches the sum.

26. Apparatus as claimed in claim 21 wherein said means for determining the quantity which is a function of a predicted steady state open circuit voltage comprises means for adding a factor to one of said voltage measurements, and means for determining said last-named factor as a function of the rate of change between said voltage measurements.

27. Apparatus as claimed in claim 26 wherein said factor determining means is operable to determine said last-named factor as a substantially anti-logarithmic function of voltage change per unit of time.

28. Apparatus as claimed in claim 26 wherein said means for determining said factor as a function of the rate of change between said voltage measurements comprises a digital counter for storing a number corresponding to said voltage change and logic gates connected to said counter and operable to determine different ranges of values for said rate of change, and at least one correction function generator connected to said logic gates and operable in response to the determination of the ranges of values for said rate of change to provide a predetermined value for said factor based upon the determined voltage change rate range.

29. Apparatus as claimed in claim 28 wherein said means for determining said factor as a function of the rate of change between said voltage measurements further includes an adder circuit, said adder circuit being connected to receive one of said voltage measurements and to add a fixed quantity to said voltage measurement to provide a zero level adjusted voltage measurement, and wherein said correction function generator comprises a multiplier circuit connected to receive the zero level adjusted voltage measurement from said adder, said multiplier being operable to multiply said zero level adjusted voltage measurement by different selected factors as selected by said different voltage change rate ranges to thereby generate a product output as said factor determined as a function of the rate of change between said voltage measurements.

30. Apparatus as claimed in claim 26 including means for subtracting a fixed factor from said one of said voltage measurements in order to provide for a zero corrected indication of state of charge upon said display means.

31. Apparatus as claimed in claim 21 wherein there is provided a temperature measurement means connected to said predicted steady state open circuit voltage function means to modify the operation of said last named means to compensate for temperature changes.

32. Apparatus as claimed in claim 21 wherein said means for measuring the time interval from the first battery terminal voltage measurement to the second battery terminal measurement comprises a digital counter and a timing oscillator, the lower order stages of said digital counter being operable to provide clock commutator switching functions for said apparatus.

* * * * *